United States Patent
Best et al.

(10) Patent No.: US 9,601,850 B2
(45) Date of Patent: Mar. 21, 2017

(54) DISPLACEABLE INSULATION BARRIER

(71) Applicant: PHOENIX CONTACT GMBH & CO. KG, Blomberg (DE)

(72) Inventors: Frank Best, Buckeburg (DE); Marco Seelig, Leopoldshohe (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 230 days.

(21) Appl. No.: 14/388,594

(22) PCT Filed: Mar. 22, 2013

(86) PCT No.: PCT/EP2013/056136
§ 371 (c)(1),
(2) Date: Sep. 26, 2014

(87) PCT Pub. No.: WO2013/144032
PCT Pub. Date: Oct. 3, 2013

(65) Prior Publication Data
US 2015/0070854 A1 Mar. 12, 2015

(30) Foreign Application Priority Data

Mar. 26, 2012 (DE) .......... 10 2012 102 567

(51) Int. Cl.
*H05K 1/00* (2006.01)
*H05K 1/18* (2006.01)
(Continued)

(52) U.S. Cl.
CPC .......... *H01R 12/71* (2013.01); *H05K 1/0256* (2013.01); *H05K 1/0306* (2013.01);
(Continued)

(58) Field of Classification Search
USPC .................. 361/748, 679, 679.01; 174/250
See application file for complete search history.

(56) References Cited

U.S. PATENT DOCUMENTS 5,944,539 A   8/1999  Ernolf et al.
6,066,006 A * 5/2000  Shaw ................ H01R 12/7088
                                                      439/212
(Continued)

FOREIGN PATENT DOCUMENTS

CN   1158690 A    9/1997
CN   1201989 A   12/1998
(Continued)

OTHER PUBLICATIONS

Information from parent PCT application No. PCT/EP2013/056136, including Search Report dated Sep. 25, 2013 (2 pgs), and IPRP with Written Opinion issued Oct. 1, 2014 (6 pgs); 8 pages total.

(Continued)

*Primary Examiner* — Andargie M Aychillhum
(74) *Attorney, Agent, or Firm* — Knobbe Martens Olson & Bear LLP

(57) ABSTRACT

The invention relates to an arrangement for increasing the insulation coordination between at least two electric potentials on a printed circuit board (2), said arrangement comprising the printed circuit board (2) and an insulation barrier (3), wherein the printed circuit board (2) has an opening (7) between the electric potentials, and the insulation barrier (3) is disposed on the printed circuit board (2) so as to be displaceble through the opening (7) and is designed such that the isolating distance between the two electric potentials can be enlarged by displacing the insulation barrier (3) relative to the printed circuit board (2). The arrangement makes it possible obtain a high packing density on the printed circuit board (2).

20 Claims, 4 Drawing Sheets

Figure 1:
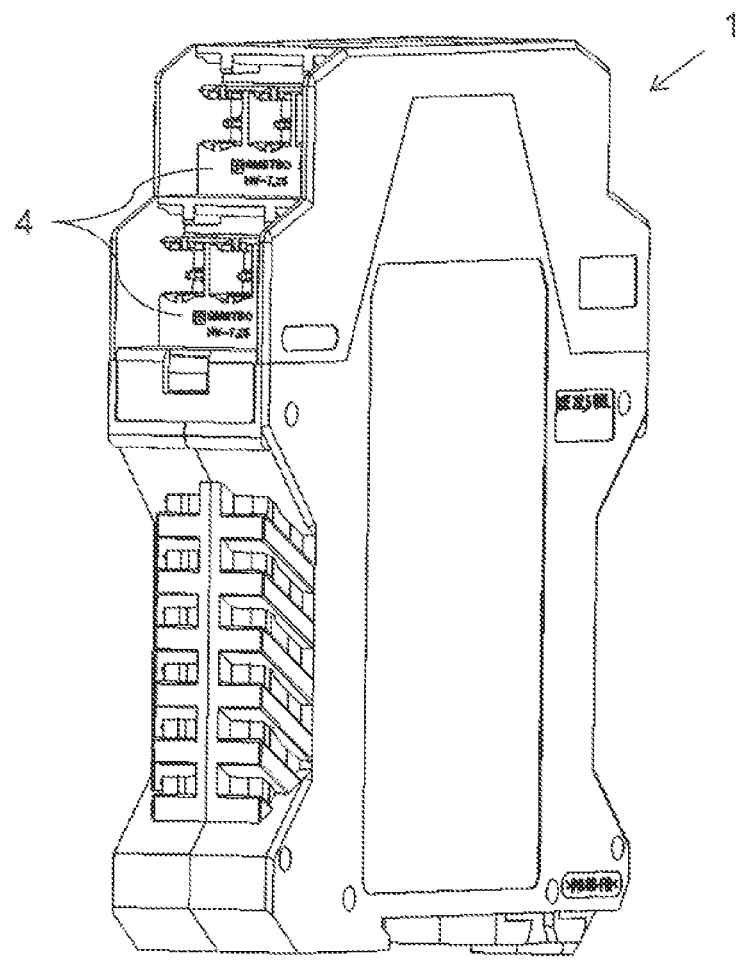

(51) Int. Cl.
*H05K 7/00* (2006.01)
*H01R 12/71* (2011.01)
*H05K 1/02* (2006.01)
*H05K 5/02* (2006.01)
*H05K 7/14* (2006.01)
*H05K 1/03* (2006.01)
*H05K 3/00* (2006.01)
*H01R 9/26* (2006.01)

(52) U.S. Cl.
CPC ......... *H05K 3/0011* (2013.01); *H05K 5/0247* (2013.01); *H05K 7/1469* (2013.01); *H01R 9/26* (2013.01); *H05K 2201/0761* (2013.01); *H05K 2201/09063* (2013.01); *H05K 2201/10189* (2013.01); *Y10T 29/49124* (2015.01)

(56) References Cited

U.S. PATENT DOCUMENTS

| | | | |
|---|---|---|---|
| 2007/0099497 A1 | 5/2007 | Agethen et al. | |
| 2007/0181636 A1* | 8/2007 | Stadlmayr | B29D 30/0662 228/101 |
| 2008/0144260 A1* | 6/2008 | Honda | H01R 43/0256 361/748 |
| 2010/0136807 A1 | 6/2010 | Appel et al. | |

FOREIGN PATENT DOCUMENTS

| | | |
|---|---|---|
| CN | 101536269 A | 9/2009 |
| DE | 197 57 938 A1 | 7/1999 |
| DE | 20 2005 017 012 U1 | 1/2006 |
| DE | 10 2006 023 660 A1 | 12/2007 |
| DE | 10 2006 052 211 A1 | 5/2008 |
| DE | 10 2008 058 936 A1 | 8/2009 |
| DE | 10 2009 005546 A1 | 12/2009 |
| DE | 10 2012 102 567 B4 | 2/2016 |

OTHER PUBLICATIONS

Full prosecution of counterpart German application No. DE 2012 10 102 567, Mar. 2012 to grant Feb. 2016 (resulting in German patent No. DE 10 2012 102 567 B4, listed above); 117 pages.

Prosecution of counterpart Chinese application No. 201380017059.5, including first Office Action dated Feb. 3, 2016 and English-language summary of same (9 pgs), second Office Action dated Sep. 20, 2016 and English-language summary of same (10 pgs), response to 2$^{nd}$ Office action filed Dec. 5, 2016 (9 pgs), and English-language summary of interview with Chinese Patent Examiner (3 pgs); 31 pages total.

Prosecution of counterpart European application No. 20130712225, including papers of potential relevance (examination not yet commenced), Sep. 2013-Apr. 2015; 36 pages.

\* cited by examiner

DISPLACEABLE INSULATION BARRIER

CROSS REFERENCE TO RELATED APPLICATIONS

This application is a U.S. National Stage Application of International Application No. PCT/EP2013/056136 filed Mar. 22, 2013, published as WO2013/144032A2, which claims priority from German Patent Application No. 10 2012 102 567.3 filed Mar. 26, 2012, which are incorporated herein by reference in entirety.

The invention relates to an arrangement for increasing the insulation coordination between at least two electric potentials on a printed circuit board. The invention further relates to a built-in housing for installation on a supporting rail, having an arrangement disposed within the housing. Finally, the invention relates to a method for increasing the insulation coordination between at least two electric potentials on a printed circuit board.

From the prior art it is known to provide printed circuit boards with electrical components, such as a base strip, which is electrically connected to a track of the printed circuit board via a solder terminal and enables electrical contacting to a plug connector corresponding to the base strip. Such a printed circuit board can then be inserted into a built-in housing, which can be secured on a supporting rail of a switching cabinet.

Provided the potentials on the printed circuit board have a comparable level, a so-called basic insulation—which is also referred to as functional insulation—is sufficient to ensure correspondingly high insulation, e.g., between the solder terminals of two different base strips. Reference is also made in this context to insulation coordination, i.e., the mutual adaptation of the electric insulations of the electric potentials of the printed circuit board, and to the endurance of the aforementioned insulations. For high-voltage applications in particular, various standards, such as DIN EN 60664, place requirements on the necessary configuration of the insulation, i.e., the design of the air gaps and/or creepage distances, for example.

If different potentials are carried on the printed circuit board, such as a "high voltage" of 630 V, for example, or a "low voltage", namely a so-called safety extra low-voltage of 120 V, for example, the insulation must be designed as a so-called double insulation, which means that the air gaps and/or creepage distances must be designed correspondingly larger than in the case of basic insulation. Specifically, this means that larger separations are required between base strips that carry potentials having different levels, which, in turn, means that greater surface area is required and the packing density of the electrical components is reduced.

The problem addressed by the invention is therefore that of making it possible to also carry potentials having different levels on a printed circuit board while ensuring that a high packing density of the electrical components can still be achieved.

The problem is solved, according to the invention, by the features of the independent claims. Advantageous embodiments of the invention are described in the dependent claims.

According thereto, the problem is solved by an arrangement for increasing the insulation coordination between at least two electric potentials on a printed circuit board, said arrangement comprising the printed circuit board and an insulation barrier, wherein the printed circuit board has an opening between the electric potentials, and the insulation barrier is disposed on the printed circuit board so as to be displaceble through the opening and is designed such that the isolating distance between the two electric potentials can be enlarged by displacing the insulation barrier relative to the printed circuit board.

An essential point of the invention, therefore, is that a displaceable insulation barrier is provided between the at least two electric potentials, i.e., for example, between a potential having "high voltage" and a potential having "low voltage", wherein said insulation barrier can be slid through the opening in the printed circuit board "between" the potentials, thereby enlarging the air gaps and/or creepage distances between the potentials. In other words, this means that the insulation coordination between the electric potentials can be increased by means of the displaceable insulation barrier. Given that the insulation barrier, in the displaced state, is disposed "between" the electric potentials, the isolating distance between the electric potentials is enlarged accordingly. The enlargement of the isolating distance is dependent on the "width" of the insulation barrier and on "how far" the insulation barrier is slid through the opening in the printed circuit board or extends beyond the surface of the printed circuit board.

The arrangement therefore makes it possible to ensure that the insulation between the different potentials is sufficient even when the printed circuit board is subjected to potentials of different levels, such as 630 V versus 50 V alternating voltage or 120 V direct voltage, and so a high packing density can be achieved on the printed circuit board.

The invention also makes it possible to provide the displaceable insulation barrier as a retrofit by forming an opening or a cutout in the printed circuit board between the electric potentials, into which the insulation barrier is inserted, said insulation barrier preferably being made of a plastic, in order to redirect the isolating distances between the electric potentials, i.e. to enlarge said isolating distances.

A further advantage of the invention is that complex, additional insulation does not need to be created when a printed circuit board—which had been subjected to potentials of comparable levels up to that point and was dimensioned accordingly in terms of the air gaps and creepage distances—is now used in a different application and is subjected to potentials having different levels, which, in the prior art, basically always made it necessary to replace the printed circuit board. For an application that has been changed in such a manner, an opening can be formed in the printed circuit board and an insulation barrier can be provided for enlarging the air gaps and/or creepage distances, wherein said insulation barrier can be slid between the potentials.

Electric potentials within the sense of the invention refer, in particular, to voltages to be determined on the printed circuit board, preferably between tracks, solder terminals of active and/or passive components and/or ground. An insulation barrier basically refers to any component that can be slid into an opening in the printed circuit board such that, in the slid-in state, the insulation barrier between the electric potentials brings about an elongation of the isolating distance, preferably the air gaps and/or creepage distances. The insulation barrier can have the shape, for example, of an elongated sheet or a profile, such as a U-shaped profile.

References made within the scope of the invention stating that the isolating distance between the two electric potentials can be enlarged by displacing the insulation barrier relative to the printed circuit board means, in particular, that the isolating distance between the at least two electric potentials is smaller when the insulation distance is not disposed on the printed circuit board and, in particular, has not been slid through the opening, than when the insulation barrier has been slid through the opening in the printed circuit board. References made to the displaced state of the insulation barrier through the opening mean, in particular, the state in which the insulation barrier is inserted into the opening and, due to the extension thereof, simultaneously extends out of the opening, away from the surface of the printed circuit board and is thereby disposed between the electric potentials such that the air gaps and/or creepage distances between the electric potentials are enlarged.

According to a preferred embodiment of the invention, the arrangement further comprises at least two electric components, wherein the electrical components are electrically connected to the printed circuit board by terminations, preferably solder terminals, the insulation barrier is displaceably disposed on one of the electrical components such that, in the state in which the insulation barrier has been slid through the opening, the isolating distance between at least one termination of at least one component and at least one termination of at least one other component is enlarged. To this end, the components can be designed as any electrical components known from the prior art, for instance as base strips for the connection of plug connectors corresponding to the base strips.

According to a further embodiment of the invention, the insulation barrier is preferably disposed and designed such that, in the displaced state of the insulation barrier, the insulation barrier is enlarged between all terminations of at least one component and all terminations of at least one other component. The terminations are preferably solder terminals. This means, therefore, that sliding a single insulation barrier into the opening enlarges the air gaps and/or creepage distances between all solder terminals of a first component and all solder terminals of at least one second component, thereby ensuring that, when the components are subjected to potentials having different levels, double insulation—which has been necessary up to now—is obtained simply by providing the insertable insulation barrier.

The insulation barrier can basically have any design; according to a particularly preferred embodiment of the invention, however, the insulation barrier is designed as a slide element and is preferably made of a plastic. Further preferably, the component and/or the insulation barrier are designed such that the insulation barrier can be or is detachably secured on the component. The insulation barrier can therefore also be retrofitted onto the component, or can be secured on the component after the component has been soldered on the printed circuit board, thereby simplifying the assembly of the component. Components that are already installed on a printed circuit board can also be retrofitted with the insulation barrier, which is particularly easy to operate as a slide element. It is also possible to provide a plurality of insulation barriers on the arrangement.

In this context it is further preferred that the slide element and the electrical component, on which the slide element is disposed, interact via a dovetail guide. Guidance that is particularly secure and reliable is thereby ensured, wherein basically any other type of guidance or displaceability of the insulation barrier relative to the printed circuit board or the component is possible.

In another embodiment of the invention, the insulation barrier is preferably disposed so as to be displaceable perpendicularly to the extension of the printed circuit board. As an alternative, the displacement can also take place at an angle of 60° or 80°, for example, relative to the surface of the printed circuit board.

According to a further particularly preferred embodiment of the invention, the insulation barrier can be fixed in the state thereof in which said insulation barrier has not been slid through the opening and/or can be fixed in the state thereof relative to the printed circuit board, in which said insulation barrier has been slid through the opening. To this end, the insulation barrier and/or the component can comprise a snap-in connection or the like, thereby enabling the insulation barrier to be locked in position at the component at least in the displaced state thereof and in the non-displaced state. In the non-displaced state, simple assembly of the component on the printed circuit board is made possible, since the insulation barrier need not be guided through the opening first in order to fix the component on the printed circuit board, by soldering, for example. By snapping the insulation barrier into position after said insulation barrier has been slid through the opening, the insulation barrier remains in the displaced position thereof if the printed circuit board or the insulation barrier are subjected to vibrations or the like, thereby making it possible, in a reliable manner, to obtain insulation that is improved as compared to the non-displaced state.

The problem is further solved by a built-in housing for installation on a supporting rail, having an arrangement of the type described above disposed within the housing. Since such built-in housings often offer space that is extremely limited, the invention makes it possible to achieve a high packing density even when potentials having highly different levels are carried on the printed circuit board. The displaceable insulation barrier is preferably held, fixed in position, between housing walls of the built-in housing.

Further embodiments and advantages of the built-in housing shall become obvious to a person skilled in the art from the comments presented above with respect to the arrangement.

The problem is further solved by the invention by a method for increasing the insulation coordination between at least two electric potentials on a printed circuit board, said arrangement comprising the printed circuit board and an insulation barrier, wherein the printed circuit board has an opening between the electric potentials, and the method has the steps of: Displacing the insulation barrier from a first position, in which the insulation barrier has not been slid through the opening, into a second position, in which the insulation barrier has been slid through the opening.

An essential point of the method, therefore, is that the insulation coordination between the at least two electric potentials can be increased by displacing the insulation barrier from the first position into the second position, namely by the fact that, in the second position, the air gap and/or creepage distance between the electric potentials "separated" by the insulation barrier is enlarged.

Further embodiments and advantages of the method become apparent to a person skilled in the art in analogy to the above-described arrangement.

The invention is described in greater detail in the following with reference to the attached drawings and on the basis of a preferred embodiment.

Figure 2:
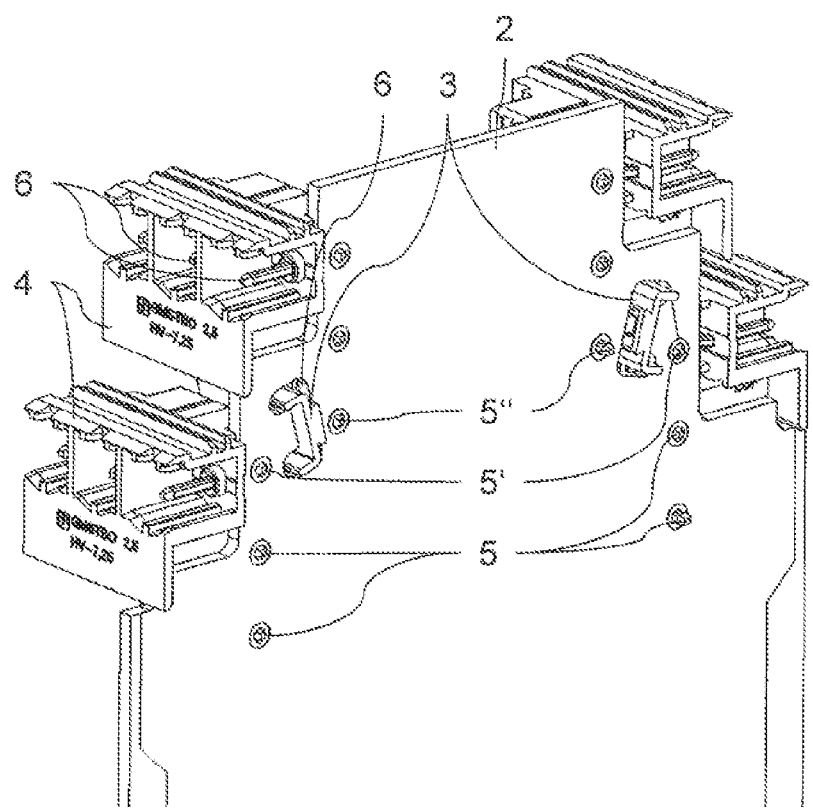
Figure 3:
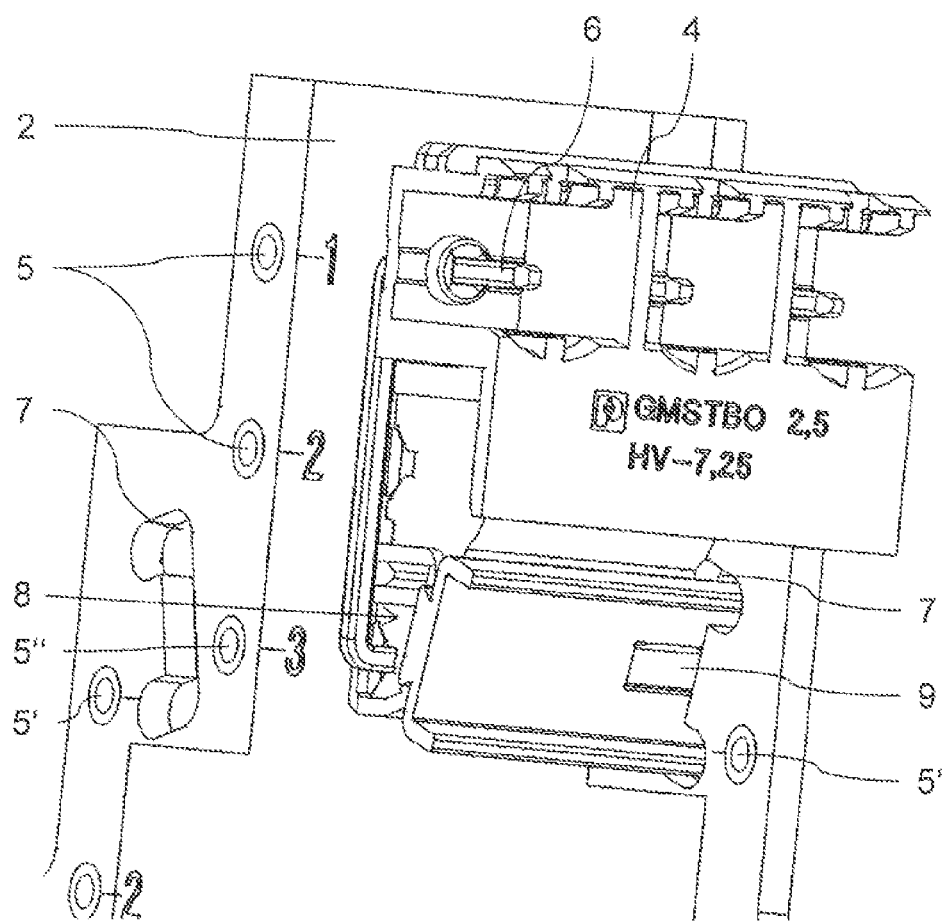
Figure 4:
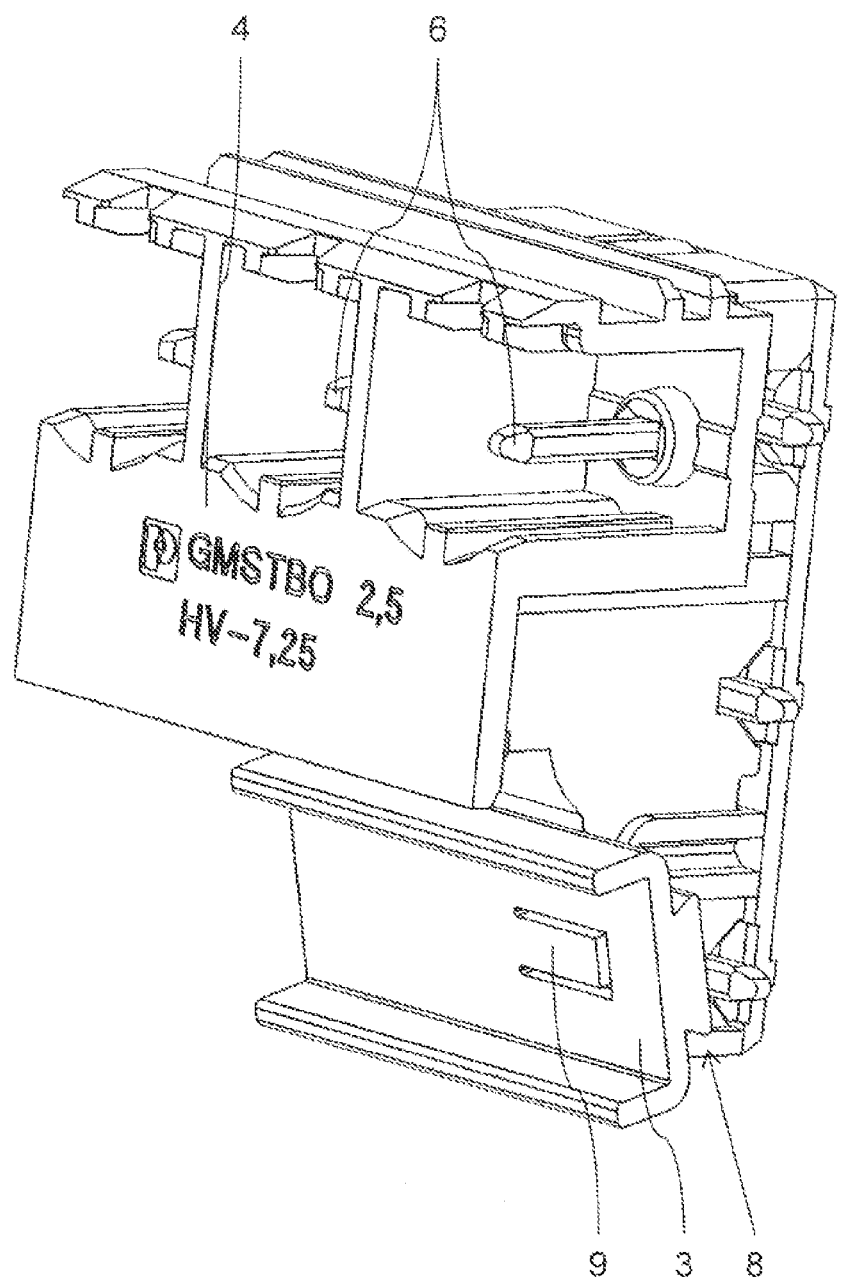

Therein:

FIG. 1 shows a built-in housing for installation on a supporting rail according to a preferred embodiment of the invention, FIG. 2 shows an arrangement comprising a printed circuit board, an insulation barrier, and an electrical component according to the preferred exemplary embodiment of the invention, FIG. 3 shows a reverse-side cutout of FIG. 2, and FIG. 4 shows an electrical component comprising an insulation barrier according to the preferred embodiment of the invention.

FIG. 1 shows a built-in housing 1 for installation on a non-illustrated supporting rail, comprising a printed circuit board 2 disposed within the housing 1, and an insulation barrier 3, which are shown in FIG. 2 and FIG. 3, and electrical components 4, which are also shown in FIGS. 2 to 4.

In the present case, the electrical components 4 are designed as base strips, into which non-illustrated plug connectors can be inserted, said plug connectors corresponding to the base strips 4. The electric contacts 6 of the components 4 are connected via solder terminals 5 to non-illustrated tracks of the printed circuit board 2.

In order to increase the isolating distance between two electric potentials of the printed circuit board 2, specifically between the solder terminals 5' and 5" indicated with prime marks, the printed circuit board 2 has an opening 7, into which the insulation barrier 3 is inserted, as shown in FIG. 2 and FIG. 3, thereby enlarging the air gap and/or creepage distance between at least the two solder terminal points 5', 5".

By providing the insulation barrier 3 in this manner, i.e. when the insulation barrier 3 is disposed between the solder terminals 5', 5" as shown in FIG. 2, the isolating distances are extended, at least between these two solder terminals 5', 5".

This means that different potentials can be carried on the printed circuit board 2 while the packing density remains high, namely, in the present case, a safety extra low-voltage of 50 V alternating voltage or 120 V direct voltage at the solder terminal 5' and a voltage up to 630 V at the second solder terminal 5", without the need to increase the insulation in a complex manner, as in the case with arrangements known from the prior art.

The insulation barrier 3, which is made of a plastic in the present case, is displaceably guided on the electrical component 4, namely via a dovetail guide 8, as shown in detail in FIG. 3 and FIG. 4. The insulation barrier 3 is designed as a slide element and can be slid through the opening 7 relative to the printed circuit board 2, perpendicularly to the extension of the printed circuit board 2, in fact from a first position, in which the insulation barrier 3 is not slid through the opening 7, into a second position, as shown in FIG. 2, in which the insulation barrier 7 has been slid through the opening 7.

Furthermore, the insulation barrier 3 or the electrical component 4 further comprises a snap-in element 9 for fixing the insulation barrier 3 in the first position and in the second position.

There are basically several ways to install the insulation barrier. For instance, the insulation barrier 3, which has a U-shaped profile in the present case, can be retrofitted on a component 4, which is already present on the printed circuit board 2, and can be inserted into an opening 7 that is already present in the printed circuit board 2 or is subsequently milled therein.

As an alternative, an insulation barrier 3 already present on a component 4 can be initially fixed in position by attaching the component 4 on the printed circuit board 2 by soldering the solder terminals 5 and, in a second step, can be slid through the opening 7 in order to extend the isolating distances at least between the two solder terminal points 5', 5", as shown in FIG. 2.

LIST OF REFERENCE SIGNS housing 1
printed circuit board 2
insulation barrier 3
component 4
solder terminal 5, 5', 5"
electric contact 6
opening 7
dovetail guide 8
snap-in element 9

The invention claimed is:

1. An arrangement for increasing the insulation coordination between at least two electric potentials on a printed circuit board, said arrangement comprising:
the printed circuit board, and
an insulation barrier, wherein the insulation barrier is designed as a slide element;
wherein the printed circuit board has an opening between the electric potentials, and the insulation barrier is disposed on the printed circuit board so as to be displaceable through the opening and is designed such than an isolating distance between the two electric potentials can be enlarged by displacing the insulation barrier relative to the printed circuit board;
wherein the insulation barrier is shaped and arranged to be fixed in a first state in which said insulation barrier has not been slid through the opening and/or is shaped and arranged to be fixed in a second state relative to the printed circuit board, in which said insulation barrier has been slid through the opening.

2. The arrangement according to claim 1, comprising at least two electrical components, wherein the electrical components are electrically connected to the printed circuit board by terminations, the insulation barrier is displaceably disposed on one of the electrical components such that, in the state in which the insulation barrier has been slid through the opening, the isolating distance between at least one termination of at least one component and at least one termination of at least one other component is enlarged.

3. The arrangement according to claim 2, wherein the terminations that electrically connect the electrical components to the printed circuit board comprise solder terminals.

4. The arrangement according to claim 2, wherein the insulation barrier is disposed and designed such that, in the displaced state of the insulation barrier, the isolating distance is enlarged between all terminations of at least one component and all terminations of at least one other component.

5. The arrangement according to claim 2, wherein the insulation barrier is designed as a slide element.

6. The arrangement according to claim 5, wherein the insulation barrier is made of plastic.

7. The arrangement according to claim 2, wherein the component and/or the insulation barrier are designed such that the insulation barrier is arranged to be detachably secured on the component.

8. The arrangement according to claim 2, wherein the slide element and the electrical component, on which the slide element is disposed, internet via a dovetail guide.

9. The arrangement according to claim 2, wherein the insulation barrier is displaceable perpendicularly to an extension of the printed circuit board.

10. The arrangement according to claim 2, wherein the insulation barrier can be fixed in a first state in which said insulation barrier has not been slid through the opening and/or can be fixed in a second state relative to the printed circuit board, in which said insulation barrier has been slid through the opening.

11. The arrangement according to claim 1, wherein the insulation barrier is disposed and designed such that, in a displaced state of the insulation barrier, the isolating distance is enlarged between all terminations of at least one component and all terminations of at least one other component.

12. The arrangement according to claim 1, wherein the component and/or the insulation barrier are designed such that the insulation barrier is arranged to be detachably secured on the component.

13. The arrangement according to claim 1, wherein the slide element and the electrical component, on which the slide element is disposed, interact via a dovetail guide.

14. The arrangement according to claim 1, wherein the insulation barrier is displaceable perpendicularly to an extension of the printed circuit board.

15. A built-in housing for installation on a supporting rail, comprising an arrangement according to claim 1, which is disposed within the housing.

16. The built-in housing according to claim 15, wherein the displaceable insulation barrier is held, fixed in position, between housing walls of the housing.

17. The arrangement according to claim 1, wherein the insulation barrier is made of a plastic.

18. A method for increasing the insulation coordination between at least two electric potentials on a printed circuit board, said arrangement comprising the printed circuit board and an insulation barrier, wherein the printed circuit board has an opening between the electric potentials, the method comprising:
  displacing the insulation barrier from a first position, in which the insulation barrier has not been slid through the opening, into a second position, in which the insulation barrier has been slid through the opening.

19. An arrangement for increasing the insulation coordination between at least two nodes with electric potentials on a printed circuit board, said arrangement comprising:
  the printed circuit board;
  an insulation barrier; and
  at least two electric components, wherein the electrical components are fixed to the printed circuit board, and electrically connected to the printed circuit board via terminations;
  wherein the printed circuit board has an opening between the electric potentials, and the insulation barrier is disposed on the printed circuit board so as to be displaceable through the opening and is designed such than isolation between the two electric potentials can be increased by displacing the insulation barrier relative to the printed circuit board.

20. The arrangement of claim 19 wherein the insulation barrier is displaceably disposed on one of the electrical components such that, in a first state in which the insulation barrier has been slid through the opening, the isolating distance between a first termination of a first electrical component and a second termination of a second electrical component is increased; and
  wherein the insulation barrier is shaped and arranged to be fixed in the first state relative to the printed circuit board, in which said insulation barrier has been slid through the opening, and shaped and arranged in a second state in which said insulation barrier has not been slid through the opening.

* * * * *